United States Patent
Park et al.

(10) Patent No.: US 9,257,437 B2
(45) Date of Patent: Feb. 9, 2016

(54) SEMICONDUCTOR DEVICE AND METHOD OF MANUFACTURING THE SAME

(71) Applicant: SAMSUNG ELECTRONICS CO., LTD., Suwon-si, Gyeonggi-do (KR)

(72) Inventors: Hoon Park, Hwaseong-si (KR); Young-Seok Kim, Seoul (KR); Yeong-Cheol Lee, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/475,687

(22) Filed: Sep. 3, 2014

(65) Prior Publication Data

US 2015/0179651 A1 Jun. 25, 2015

(30) Foreign Application Priority Data

Dec. 20, 2013 (KR) .................. 10-2013-0160022

(51) Int. Cl.
*H01L 27/108* (2006.01)
*H01L 21/764* (2006.01)

(52) U.S. Cl.
CPC ........ *H01L 27/10885* (2013.01); *H01L 21/764* (2013.01); *H01L 27/10814* (2013.01); *H01L 27/10855* (2013.01); *H01L 27/10888* (2013.01); *H01L 27/10873* (2013.01)

(58) Field of Classification Search
None
See application file for complete search history.

(56) References Cited

U.S. PATENT DOCUMENTS

| | | | |
|---|---|---|---|
| 7,759,722 B2 | 7/2010 | Murata et al. | |
| 7,763,931 B2 | 7/2010 | Hashiguchi et al. | |
| 2003/0173597 A1 | 9/2003 | Kamiya | |
| 2008/0290523 A1 | 11/2008 | Teramoto | |
| 2012/0269006 A1* | 10/2012 | Park | H01L 21/764 365/189.05 |
| 2013/0160868 A1 | 6/2013 | Esche et al. | |
| 2013/0186300 A1 | 7/2013 | Roschmann et al. | |
| 2014/0110816 A1* | 4/2014 | Kim | H01L 27/10855 257/499 |
| 2014/0231892 A1* | 8/2014 | Song | H01L 21/76897 257/296 |

FOREIGN PATENT DOCUMENTS

| | | |
|---|---|---|
| JP | 2000-223439 A | 8/2000 |
| JP | 2005-011935 A | 1/2005 |
| KR | 10-2000-0027188 A | 5/2000 |
| KR | 10-2001-0063492 A | 7/2001 |
| KR | 10-0725713 B1 | 5/2007 |

* cited by examiner

*Primary Examiner* — Yasser A Abdelaziez
(74) *Attorney, Agent, or Firm* — Lee & Morse, P.C.

(57) ABSTRACT

A semiconductor device includes a bit line structure on a substrate, the bit line structure having a polysilicon layer pattern doped with impurities, and a metal layer pattern on the polysilicon layer pattern, a first spacer surrounding and contacting a sidewall of the bit line structure, the first spacer having a constant thickness, and a capacitor contact structure on the substrate, an air gap being defined between the capacitor contact structure and the first spacer.

13 Claims, 24 Drawing Sheets

FIRST DIRECTION
SECOND DIRECTION
THIRD DIRECTION

FIRST
DIRECTION

SECOND
DIRECTION

THIRD
DIRECTION

SEMICONDUCTOR DEVICE AND METHOD OF MANUFACTURING THE SAME

CROSS-REFERENCE TO RELATED APPLICATION

Korean Patent Application No. 10-2013-0160022, filed on Dec. 20, 2013, in the Korean Intellectual Property Office, and entitled: "Semiconductor Device And Method Of Manufacturing The Same," is incorporated by reference herein in its entirety.

BACKGROUND

1. Field

Example embodiments relate to a semiconductor device and a method of manufacturing the same. More particularly, example embodiments relate to a semiconductor device including a wiring structure and a method of manufacturing the same.

2. Description of the Related Art

A buried channel array transistor (BCAT) and wiring structures, e.g., a bit line, electrically connected thereto, may be formed to manufacture a semiconductor device with a high integration degree. Sidewalls of the wiring structures may be covered by a spacer.

SUMMARY

According to example embodiments, there is provided a semiconductor device. The semiconductor device includes a bit line structure, a first spacer and a capacitor contact structure. The bit line structure may be formed on a substrate to include a polysilicon layer pattern doped with impurities and a metal layer pattern on the polysilicon layer pattern. The first spacer having a constant thickness may surround and contact a sidewall of the bit line structure. The capacitor contact structure on the substrate together with the first spacer may define an air gap therebetween.

In example embodiments, the first spacer may include silicon nitride.

In example embodiments, the semiconductor device may further include a bit line contact contacting a bottom of the bit line structure on the substrate.

In example embodiments, the bit line contact may include polysilicon.

In example embodiments, the bit line structure may further include a barrier layer pattern including a metal nitride between the polysilicon layer pattern and the metal layer pattern.

In example embodiments, the semiconductor device may further include a second spacer surrounding a lower sidewall of the capacitor contact structure.

In example embodiments, the semiconductor device may further include a third spacer surrounding an upper sidewall of the capacitor contact structure and contacting an upper sidewall of the first spacer In example embodiments, the semiconductor device may further include a gate structure and an impurity region. The gate structure may be buried at an upper portion of the substrate. The impurity region may be formed at an upper portion of the substrate adjacent to the gate structure. The bit line structure may be electrically connected to the impurity region.

According to other example embodiments, there is provided a method of manufacturing a semiconductor device. In the method, a bit line structure may be formed on a substrate to include a polysilicon layer pattern doped with impurities and a metal layer pattern on the polysilicon layer pattern. A first spacer having a constant thickness may be formed to surround and contact a sidewall of the bit line structure. A capacitor contact structure may be formed on the substrate to define an air gap together with the first spacer therebetween.

In example embodiments, when the first spacer is formed, a first insulating layer including a nitride may be formed on the sidewall of the bit line structure by a plasma treatment process. A second insulating layer including a nitride may be formed on the first insulating layer. The first and second insulating layers may be anisotropically etched. The first and second insulating layers may be merged to each other.

In example embodiments, a bit line contact may be further formed on the substrate to contact a bottom of the bit line structure.

In example embodiments, the bit line structure may be formed to further include a barrier layer pattern between the polysilicon layer pattern and the metal layer pattern.

In example embodiments, when the capacitor contact structure is formed, a first sacrificial layer may be formed to partially cover the first spacer, and a second sacrificial may be formed to contact the first sacrificial layer pattern. The second sacrificial layer pattern may be removed to form an opening exposing a top surface of the substrate. A lower capacitor contact may be formed on the exposed top surface of the substrate to fill the opening. The first sacrificial layer pattern may be removed. A third spacer may be formed on a sidewall of the first spacer and the lower capacitor contact to define the air gap. An upper capacitor contact may be formed on the lower capacitor contact.

In example embodiments, the first sacrificial layer pattern may be formed to include silicon oxide, and when the first sacrificial layer pattern is removed, a wet etching process may be performed.

In example embodiments, after forming the opening, a second spacer may be further formed on a sidewall of the opening.

According to yet other example embodiments, there is provided a semiconductor device including a bit line structure on a substrate, the bit line structure having a polysilicon layer pattern doped with impurities, and a metal layer pattern on the polysilicon layer pattern, a first spacer surrounding and contacting a sidewall of the bit line structure, a capacitor contact structure on the substrate, and an air gap between the capacitor contact structure and the first spacer, the air gap being in direct contact with the first spacer.

In example embodiments, the first spacer may be a single silicon nitride layer with a constant thickness.

In example embodiments, the first spacer may be directly between the bit line structure and the air gap.

In example embodiments, the first spacer may completely cover the sidewall of the bit line structure, a portion of the first spacer extends laterally to cover a portion of an upper surface of the substrate.

In example embodiments, the semiconductor device may further include a second spacer surrounding a lower sidewall of the capacitor contact structure, the air gap being between the first and second spacer.

BRIEF DESCRIPTION OF THE DRAWINGS

Example embodiments will be more clearly understood from the following detailed description taken in conjunction with the accompanying drawings.

FIGS. 1 and 2 illustrate cross-sectional views of a semiconductor device in accordance with example embodiments;

FIGS. 3, 6, 11 and 16 illustrate plan views of stages in a method of manufacturing a semiconductor device in accordance with example embodiments; and FIGS. 4, 5, 7-10, 12-15, and 17-26 illustrate cross-sectional views of a semiconductor device in accordance with example embodiments.

DETAILED DESCRIPTION

Figure 1:
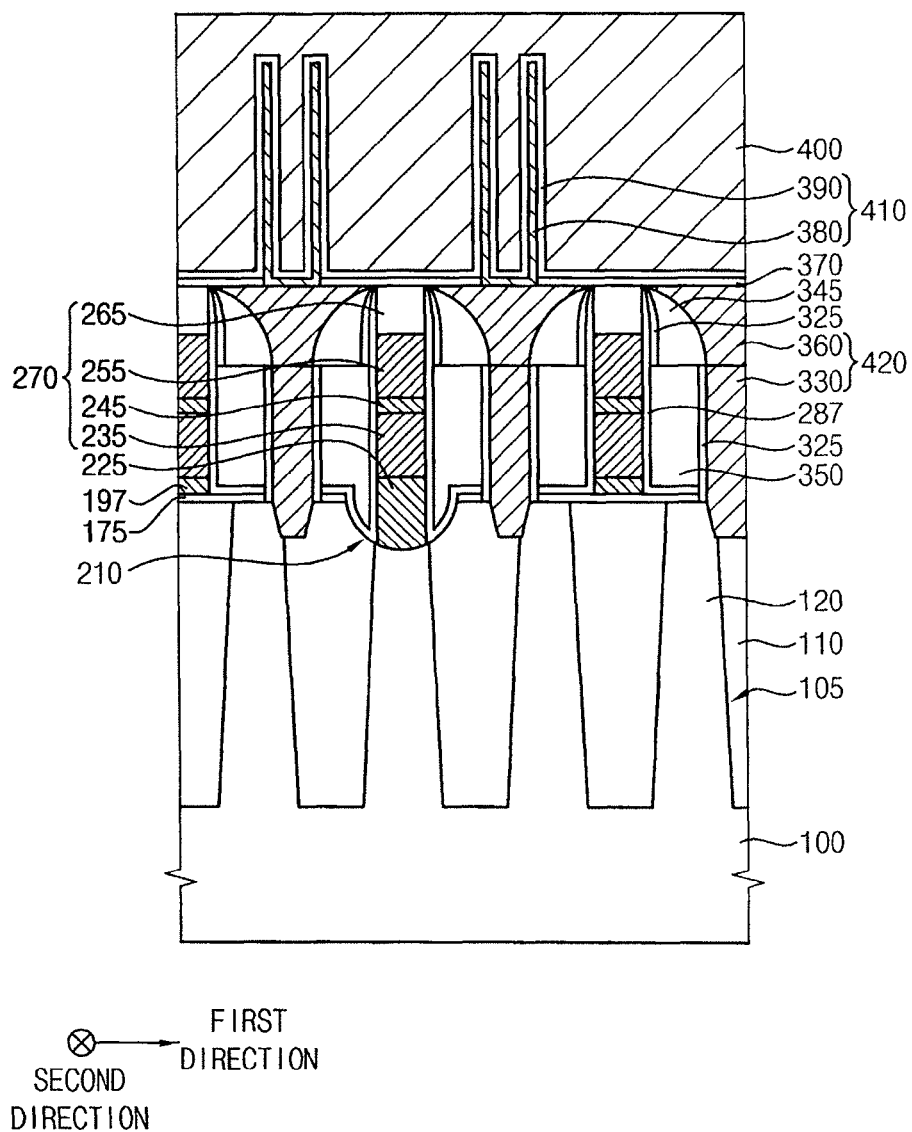
FIGS. 1 to 26 represent non-limiting, example embodiments as described herein.

Various example embodiments will be described more fully hereinafter with reference to the accompanying drawings, in which some example embodiments are shown. Example embodiments may, however, be embodied in many different forms and should not be construed as limited to those set forth herein. Rather, these example embodiments are provided so that this description will be thorough and complete, and will fully convey the scope of the exemplary implementations to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
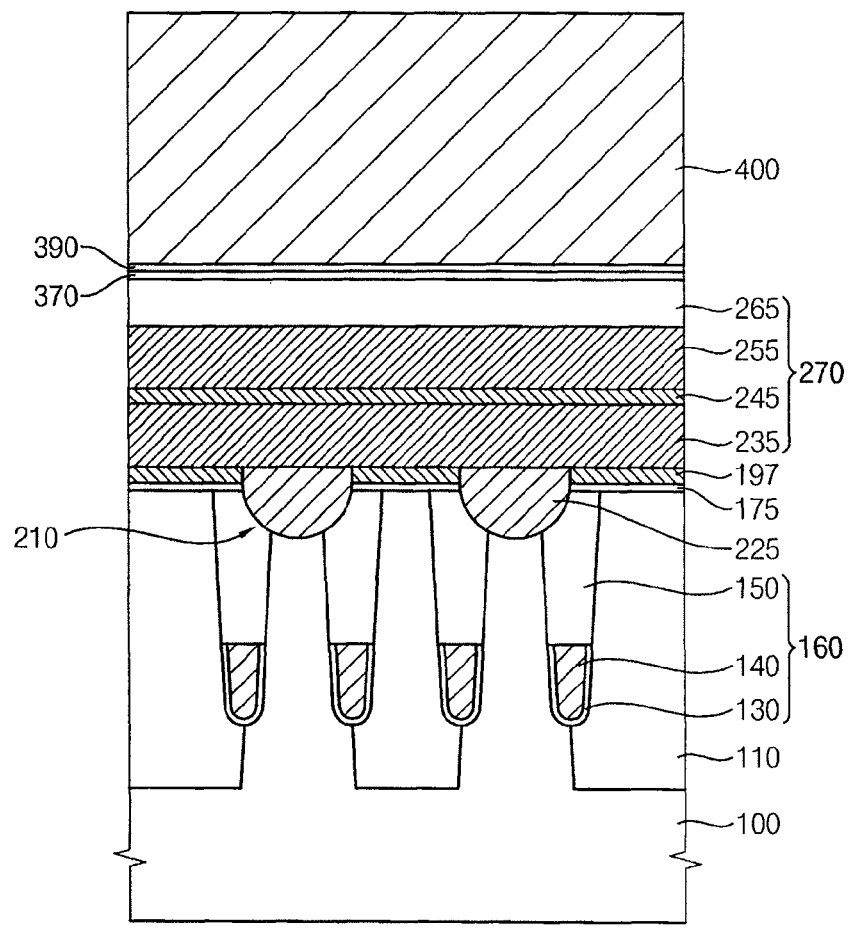

FIGS. 1 and 2 illustrate cross-sectional views of a semiconductor device in accordance with example embodiments. Particularly, FIG. 1 illustrates a cross-sectional view of the semiconductor device cut along a first direction parallel to a top surface of a substrate, and FIG. 2 illustrates a cross-sectional view of the same semiconductor device cut along a second direction parallel to the top surface of the substrate and substantially perpendicular to the first direction.

Referring to FIGS. 1 and 2, the semiconductor device may include a substrate 100, a bit line contact 225, a bit line structure 270, a first spacer 287, and a capacitor contact structure 420. The semiconductor device may further include second and third spacers 325 and 345, a gate structure 160, an impurity region (not shown), and a capacitor 410.

The substrate 100 may be, e.g., a silicon substrate, a germanium substrate, a silicon-germanium substrate, a silicon-on-insulator (SOI) substrate, a germanium-on-insulator (GOI) substrate, etc. The substrate 100 may include an isolation layer pattern 110 thereon, so a first portion of the substrate 100, i.e., on which the isolation layer pattern 110 is formed, may be defined as a field region, and a second portion of the substrate 100, i.e., on which no isolation layer pattern is formed, may be defined as an active region 120. The isolation layer pattern 110 may include an oxide, e.g., silicon oxide, etc.

A top surface of the active region 120 may be partially exposed by a recess 210 formed at an upper portion of the substrate 100. In example embodiments, a plurality of recesses 210 may be formed in the first and second directions, respectively.

The gate structure 160 may include a gate electrode 140 and a capping layer pattern 150 sequentially buried at an upper portion of the substrate 100, and may include a gate insulation layer 130 buried at the upper portion of the substrate 100 and surrounding a sidewall and a bottom surface of the gate electrode 140. A bottom surface of the capping layer pattern 150 may contact top surfaces of the gate electrode 140 and the gate insulation layer 130. In example embodiments, a plurality of gate structures 160 may be formed in the second direction, e.g., spaced apart from each other in the second direction. In example embodiments, each gate structure 160 may extend in the first direction, and two gate structures 160 may be formed in each active region 120 of the substrate 100. The gate electrode 140 may include, a metal, e.g., tungsten (W), titanium (Ti), tantalum (Ta), etc., or a metal nitride, e.g., tungsten nitride (WN), titanium nitride (TiN), tantalum nitride (TaN), etc. The gate insulation layer 130 may include an oxide, e.g., silicon oxide, etc. The capping layer pattern 150 may include a nitride, e.g., silicon nitride, etc.

The impurity region may be formed at an upper portion of the active region 120 adjacent to the gate structure 160, and may include, e.g., n-type impurities such as phosphorus, arsenic, etc., or p-type impurities such as boron, gallium, etc. The gate structure 160 together with the impurity region may be defined as a transistor, and the impurity region may be provided as source/drain regions of the transistor.

The bit line contact 225 may be formed on a bottom surface of the recess 210 to fill a portion of the recess 210. Accordingly, the bit line contact 225 may contact the active region 120 to be electrically connected to the transistor. In example embodiments, a plurality of bit line contacts 225 may be formed in the first and second directions, respectively. The bit line contact 225 may include, e.g., polysilicon doped with impurities.

The bit line structure 270 may be formed on the bit line contact 225, and may include a polysilicon layer pattern 235, a barrier layer pattern 245, a metal layer pattern 255, and a third mask 265 sequentially stacked. The polysilicon layer pattern 235 may include conductive impurities, and may contact the bit line contact 225. Accordingly, the bit line structure 270 may be electrically connected to the transistor. The metal layer pattern 255 may include a metal, e.g., tungsten (W). The barrier layer pattern 245 may include a metal nitride, e.g., tungsten nitride (WN), titanium nitride (TiN), tantalum nitride (TaN), etc. The third mask 265 may include a nitride, e.g., silicon nitride, etc. In example embodiments, a plurality of bit line structures 270 may be formed to be spaced apart from each other in the first direction, each of which may extend in the second direction.

The first spacer 287 may surround sidewalls of the bit line contact 225 and of the bit line structure 270, and may contact the bit line contact 225 and the bit line structure 270. For example, as illustrated in FIG. 1, the first spacer 287 may be directly on the, e.g., entire height of, sidewalls of the bit line contact 225 and of the bit line structure 270. Accordingly, a plurality of first spacers 287 may be formed in the first direction, e.g., spaced apart from each other along the first direction to contact each bit line contact 225 and bit line structure 270. Each first spacer 287 may extend in the second direction, e.g., along an entire length of each bit line contact 225 and bit line structure 270 in the second direction. The first spacer 287 may have a constant thickness along the first direction, and may include a nitride, e.g., silicon nitride, etc. The first spacer 287 may be also formed on an upper inner wall of the recess 210 and on the substrate 100, e.g., extend from a bottom of the sidewall of the bit line contact 225 along the upper inner wall of the recess 210 toward a top of the substrate 100.

The capacitor contact structure 420 may be formed on the substrate 100 to be spaced apart from the bit line contact 225 and the bit line structure 270, e.g., along the first direction. An air gap 350 may be defined between the capacitor contact structure 420 and the first spacer 287, e.g., the air gap 350 may be defined between a portion of a second spacer 325 on a portion of a sidewall of the capacitor contact structure 420 and the first spacer 287. The capacitor contact structure 420 may include a lower capacitor contact 330 and an upper capacitor contact 360 sequentially stacked on the substrate 100, and may contact the active region 120 of the substrate 100. In example embodiments, the lower capacitor contact 330 may include a material substantially the same as that of the upper capacitor contact 360, e.g., a metal and/or polysilicon doped with impurities.

The second spacer 325 may be formed on the substrate 100 to surround, e.g., overlap, a sidewall of the lower capacitor contact 330, and to extend on an upper sidewall of the first spacer 287 to surround an upper sidewall of the bit line structure 270. For example, as illustrated in FIG. 1, a first portion of the second spacer 325 may be directly between the air gap 350 and the lower capacitor contact 330, and a second portion of the second spacer 325 may be above the first portion of the second spacer 325 and directly on the first spacer 287, e.g., the first and second portions of the second spacer 325 may be discontinuous and spaced apart from each other along the first direction. In example embodiments, the first portion of the second spacer 325 surrounding the sidewall of the lower capacitor contact 330 may have a top surface lower than that of the first spacer 287, and may contact a portion of the sidewall of the first spacer 287, e.g., the first portion of the second spacer 325 may contact a portion of the sidewall of the first spacer 287 that extends horizontally along the air gap 350. The second spacer 325 may include a nitride, e.g., silicon nitride, etc.

The third spacer 345 may surround a sidewall, e.g., an inner sidewall, of the upper capacitor contact 360 to contact the second portion of the second spacer 325 on the upper sidewall of the first spacer 287. In example embodiments, the third spacer 345 may contact the first portion of the second spacer 325 surrounding a sidewall of the lower capacitor contact 330. In some embodiments, the third spacer 345 may also contact a top surface of the lower capacitor contact 330. For example, as illustrated in FIG. 1, the third spacer 345 may be between the upper capacitor contact 360 and the second portion of the second spacer 325 to overlap a portion of the air gap 350. The third spacer 345 may include a nitride, e.g., silicon nitride, etc.

The capacitor 410 may be formed on the capacitor contact structure 420, and may include a lower electrode 380, a dielectric layer 390, and an upper electrode 400. The lower electrode 380 may contact a portion of a top surface of the upper capacitor contact structure 360. The lower electrode 380 may have a cylindrical shape as shown in FIG. 1. Alternatively, the lower electrode 380 may have a pillar shape. The dielectric layer 390 may be formed on the lower electrode 380 to cover a surface thereof, and the upper electrode 400 may be formed on the dielectric layer 390 to sufficiently cover the dielectric layer 390.

In example embodiments, the lower electrode 380 may include a material substantially the same as that of the upper electrode 400, e.g., polysilicon doped with impurities and/or a metal. The dielectric layer 390 may include an oxide, e.g., silicon oxide, a metal oxide, etc., and/or a nitride, e.g., silicon nitride, a metal nitride, etc. The metal may include, e.g., at least one of aluminum (Al), zirconium (Zr), titanium (Ti), Hafnium (Hf), etc. An etch stop layer 370 may be further formed between a lower structure including the bit line structure 270 and capacitor contact structure 420, and the dielectric layer 390.

FIGS. 3 to 26 illustrate plan views and cross-sectional views of stages of a method of manufacturing a semiconductor device in accordance with example embodiments. Particularly, FIGS. 3, 6, 11 and 16 illustrate plan views of the semiconductor device, FIGS. 4, 7, 9, 12, 14, 17, and 19-26 illustrate cross-sectional views along line G-G' of respective FIGS. 3, 6, 11 and 16, and FIGS. 5, 8, 10, 13, 15 and 18 are cross-sectional views along line K-K' of respective FIGS. 3, 6, 11 and 16. Line G-G' extends in the first direction substantially parallel to the top surface of the substrate, and line K-K' extends in the second direction substantially parallel to the top surface of the substrate and substantially perpendicular to the first direction.

Figure 3:
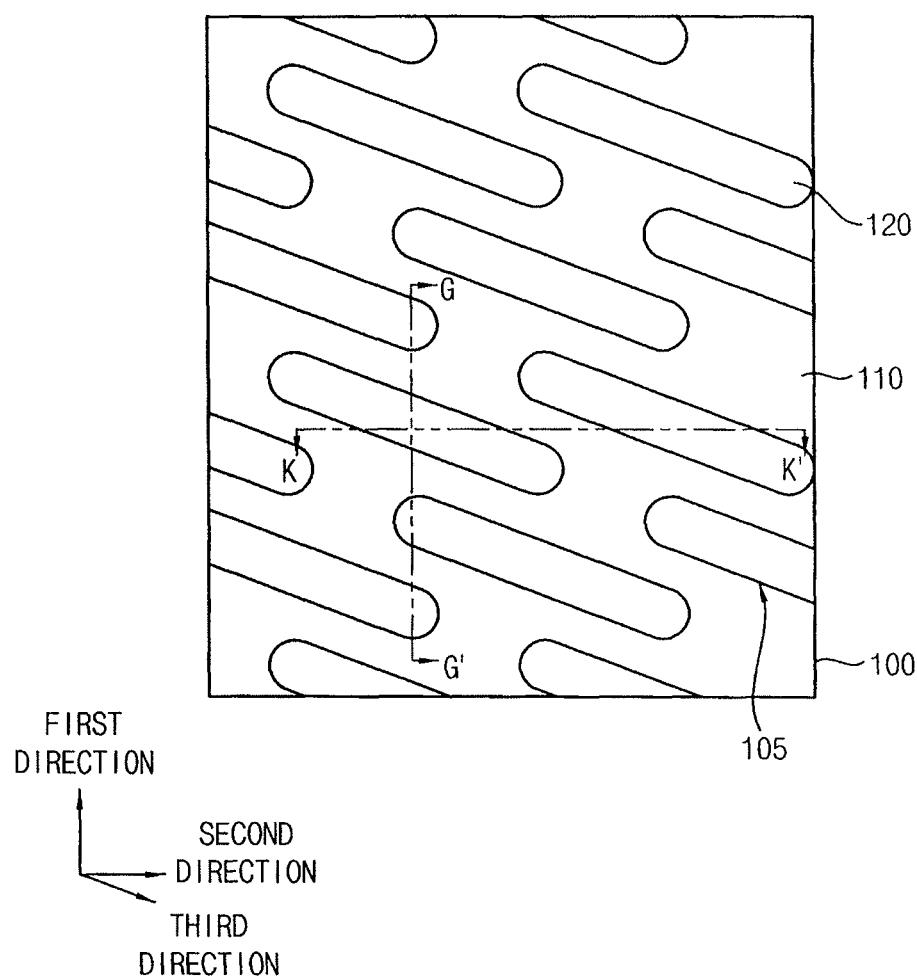
Figure 4:
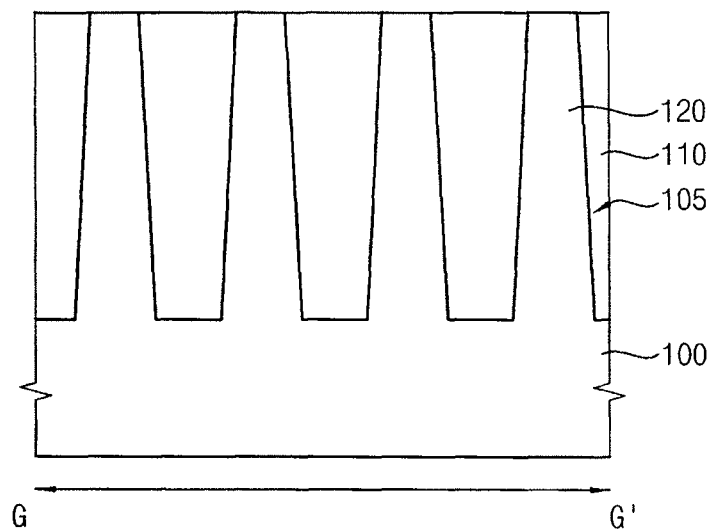
Figure 5:
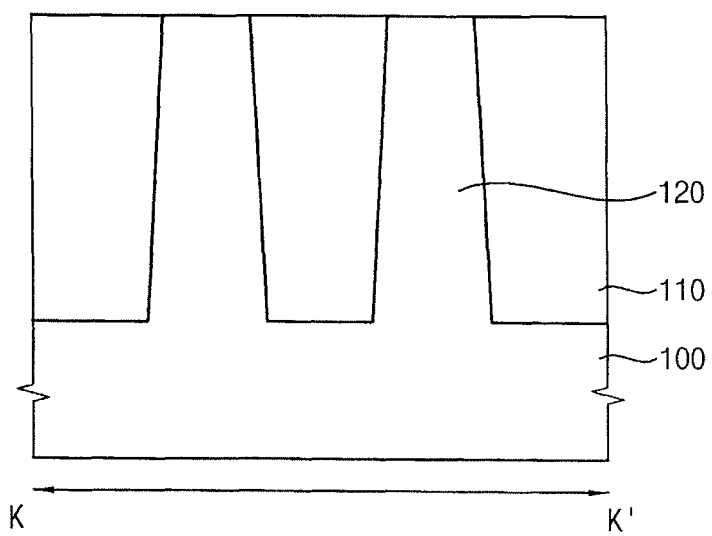

Referring to FIGS. 3 to 5, a first mask (not shown) may be formed on the substrate 100, and an upper portion of the substrate 100 may be partially removed using the first mask as an etching mask to form a first trench 105. The substrate 100 may be, e.g., a silicon substrate, a germanium substrate, a silicon-germanium substrate, a silicon-on-insulator (SOI) substrate, a germanium-on-insulator (GOI) substrate, etc. The first mask may be formed to include a nitride, e.g., silicon nitride, etc.

The isolation layer pattern 110 may be formed in the first trench 105. The isolation layer pattern 110 may be formed by forming an isolation layer on the substrate 100 to sufficiently fill the first trench 105, and planarizing an upper portion of the isolation layer until a top surface of the substrate 100 is exposed. The isolation layer may be formed to include an oxide, e.g., silicon oxide, etc.

Accordingly, a portion of the substrate 100, i.e., on which the isolation layer pattern 110 is formed, may be defined as a field region, and a portion of the substrate 100, i.e., on which no isolation layer pattern is formed, may be defined as the active region 120. In example embodiments, a plurality of active regions 120 may be formed to have island shapes spaces apart from each other (FIG. 3), each of which may extend in a third direction neither parallel nor perpendicular to either the first direction or the second direction but substantially parallel to the top surface of the substrate 100.

After forming the isolation layer pattern 110, the first mask may be removed by, e.g., a wet etching process.

Figure 6:
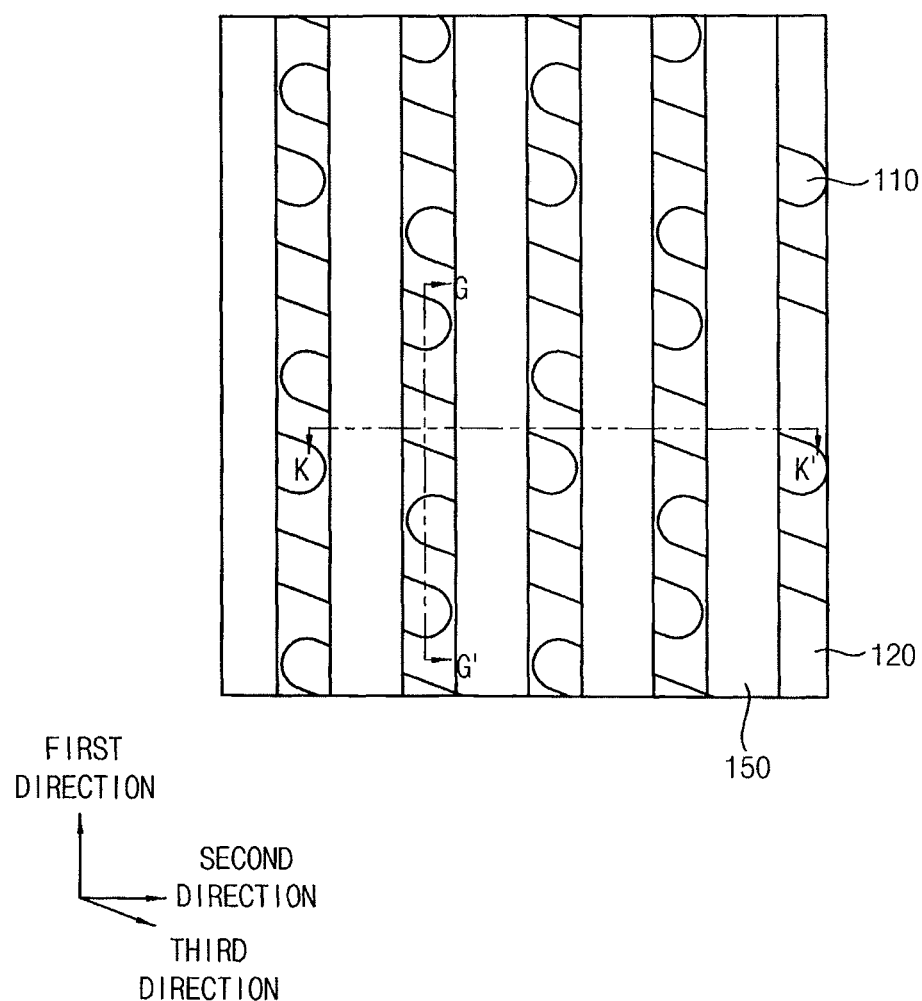
Figure 7:
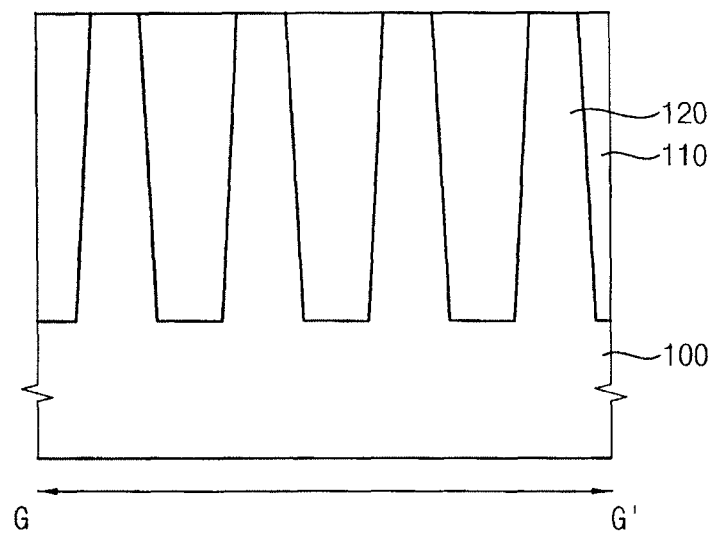
Figure 8:
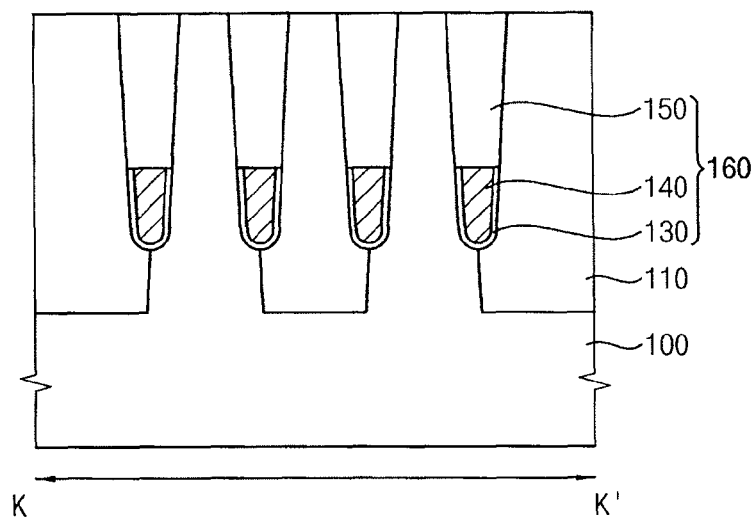

Referring to FIGS. 6 to 8, impurities may be doped into the upper portion of the substrate 100 to form an impurity region (not shown). In example embodiments, the impurity region may be formed by performing an ion implantation process onto the upper portion of the substrate 100. The impurity region may be formed to include, e.g., n-type impurities such as phosphorus, arsenic, etc., or p-type impurities such as boron, gallium, etc.

The substrate 100 and the isolation layer pattern 110 may be partially etched to form a second trench (not shown), and the gate structure 160 may be formed in the second trench. Accordingly, a plurality of second trenches may be formed in the second direction, each of which may extend in the first direction. In example embodiments, two gate structures 160 may be formed in each active region 120.

The gate structure 160 may be formed to include the gate insulation layer 130, the gate electrode 140, and the capping layer pattern 150. The gate insulation layer 130 may be formed on a lower inner wall of the second trench, the gate electrode 140 may be formed on the gate insulation layer 130 to fill a lower portion of the second trench, and the capping layer pattern 150 may be formed on the gate insulation layer 130 and the gate electrode 140 to fill an upper portion of the second trench.

In example embodiments, the gate insulation layer 130 may be formed by a thermal oxidation process or a chemical vapor deposition (CVD) process. Accordingly, the gate insulation layer 130 may be formed to include an oxide, e.g., silicon oxide, etc.

A gate electrode layer may be formed on the gate insulation layer 130, the isolation layer pattern 110, and the substrate 100 to sufficiently fill the second trench, and an upper portion of the gate electrode layer may be removed by a chemical mechanical polishing (CMP) process and/or an etch back process to form the gate electrode 140. When the gate electrode is formed, an upper portion of the gate insulation layer 130 may be also removed, and thus the gate insulation layer 130 on the lower inner wall of the second trench may surround a sidewall and a bottom surface of the gate electrode 140. The gate electrode layer may be formed to include a metal, e.g., tungsten (W), titanium (Ti), tantalum (Ta), etc. or a metal nitride, e.g., tungsten nitride (WN), titanium nitride (TiN), tantalum nitride (TaN), etc.

A capping layer may be formed on the gate insulation layer 130, the gate electrode 140, the isolation layer pattern 110, and the substrate 100 to sufficiently fill a remaining portion of the second trench, and an upper portion of the capping layer may be planarized until a top surface of the isolation layer pattern 110 is exposed. The capping layer may be formed to include a nitride, e.g., silicon nitride, etc.

The impurity region together with the gate structure 160 may be defined as a transistor, and the impurity region may serve as source/drain regions of the transistor. In other example embodiments, after forming the gate structure 160, the impurity region may be formed.

Figure 9:
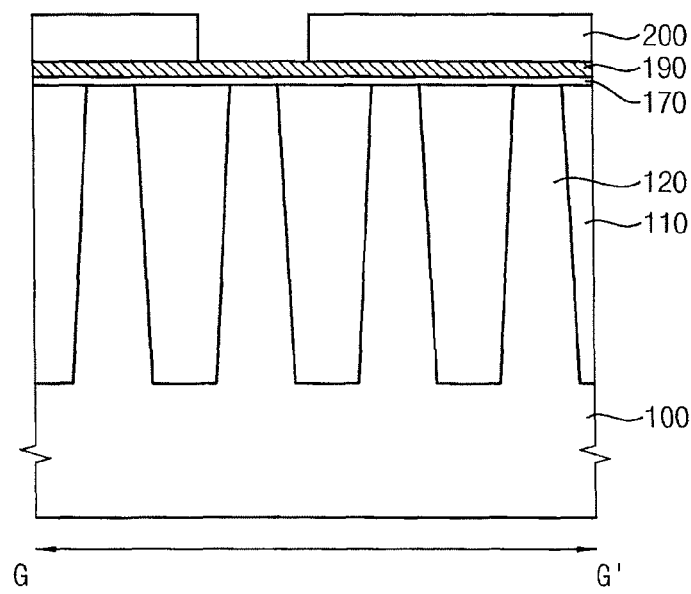
Figure 10:
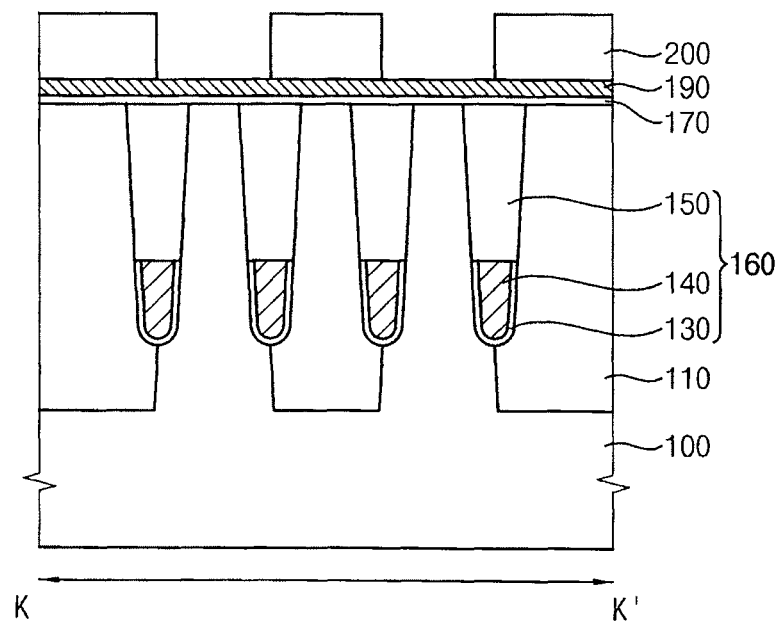

Referring to FIGS. 9 and 10, a pad layer 170, a first conductive layer 190, and a second mask 200 may be sequentially formed on the substrate 100, the isolation layer pattern 110, and the capping layer pattern 150. The second mask 200 may be formed to expose a portion of a top surface of the first conductive layer 190 overlapping the active region 120.

The first conductive layer 190 may be formed to include, e.g., polysilicon doped with impurities. The first conductive layer 190 may be formed to have a first thickness, e.g., about 60 angstroms. The pad layer 170 may be formed to include an oxide, e.g., silicon oxide.

Figure 11:
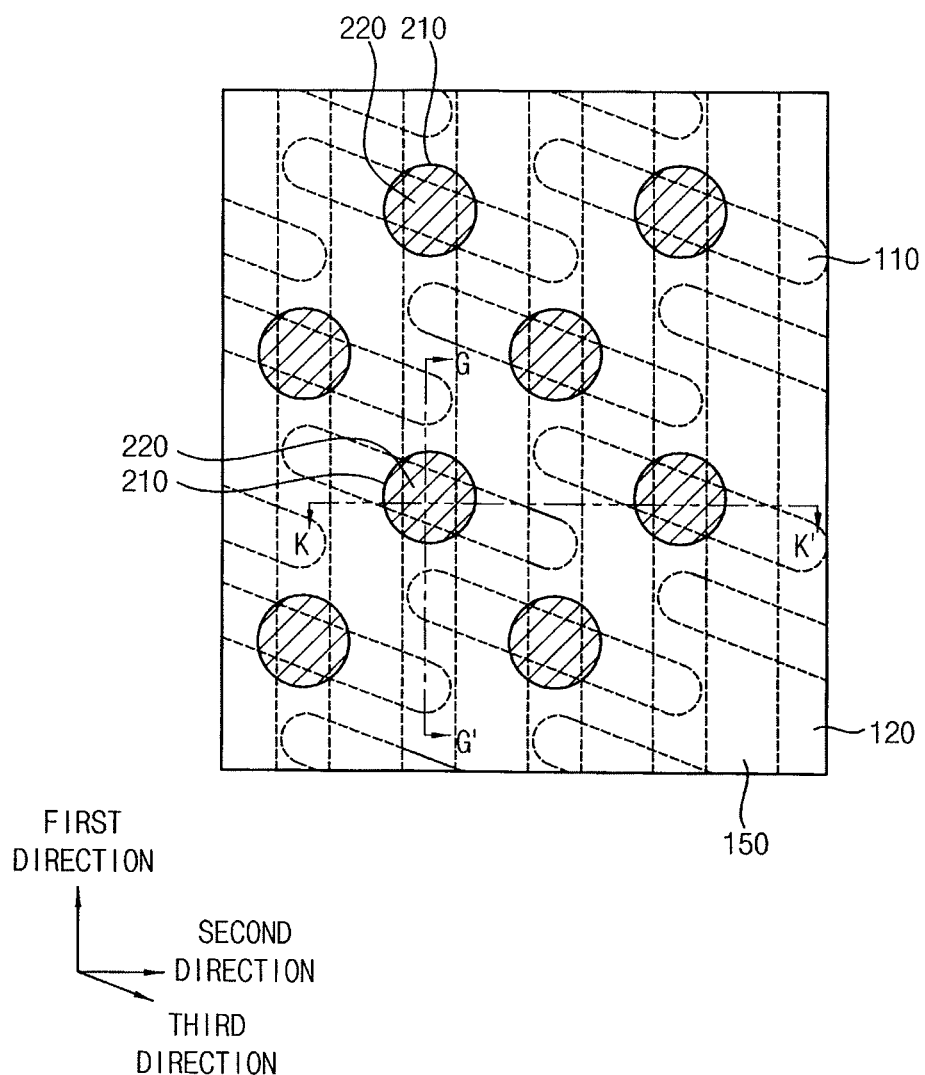
Figure 12:
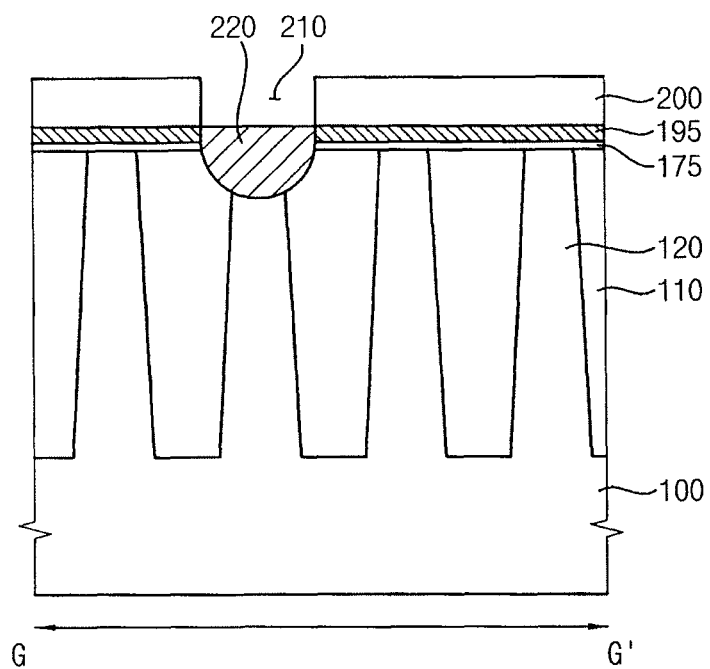
Figure 13:
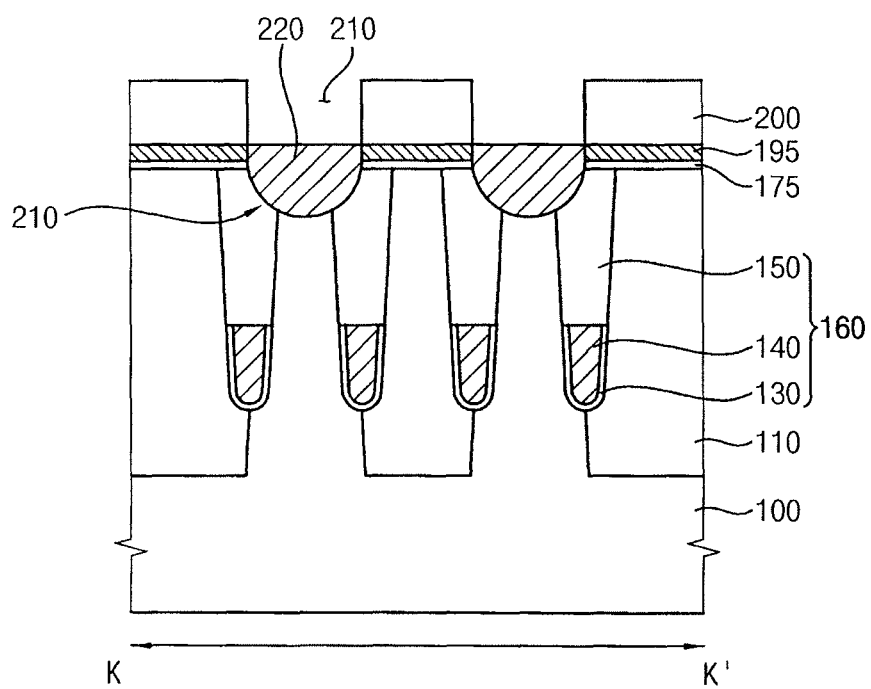

Referring to FIGS. 11 to 13, the first conductive layer 190, the pad layer 170, and an upper portion of the substrate 100 may be etched using the second mask 200 as an etching mask to form the recess 210, and a second conductive layer pattern 220 filling the recess 210 may be formed. The first conductive layer 170 and the pad layer 190 may be partially removed by the etching process to form a first conductive layer pattern 195 and a pad layer pattern 175.

In example embodiments, a plurality of recesses 210 may be formed in the first and second directions, respectively. When the recess 210 is formed, an upper portion of the active region 120 may be removed, and portions of the capping layer pattern 150 and the isolation layer pattern 110 adjacent thereto may be also removed.

A second conductive layer may be formed on the substrate 100, the isolation layer pattern 110, the capping layer pattern 150, and the second mask 200 to sufficiently fill the recess 210, and an upper portion of the second conductive layer may be removed by a CMP process and/or an etch back process to form the second conductive layer pattern 220. Accordingly, a plurality of second conductive layer patterns 220 may be formed in the first and second directions, respectively, each of which may be formed to have a top surface substantially coplanar with the top surface of the first conductive layer pattern 195. The second conductive layer may be formed to include, e.g., polysilicon doped with impurities.

The second mask 200 may be removed by, e.g., a wet etching process, and a cleaning process may be performed on the substrate 100. In example embodiments, the cleaning process may be performed by a strip process and/or a plasma native-oxide cleaning (PNC) process. Accordingly, a native oxide layer may not remain on the first and second conductive layer patterns 195 and 220.

Figure 14:
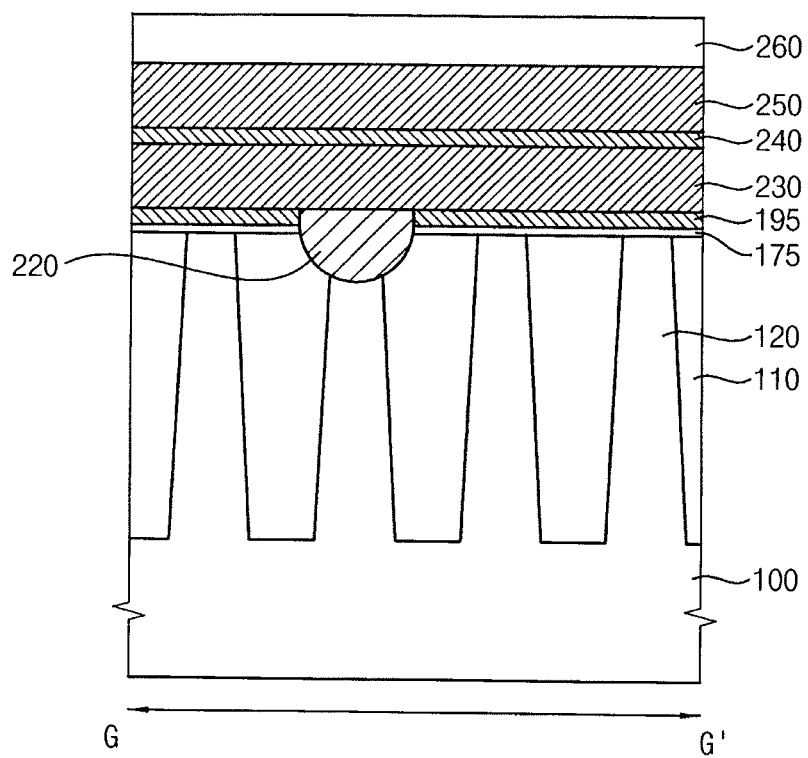
Figure 15:
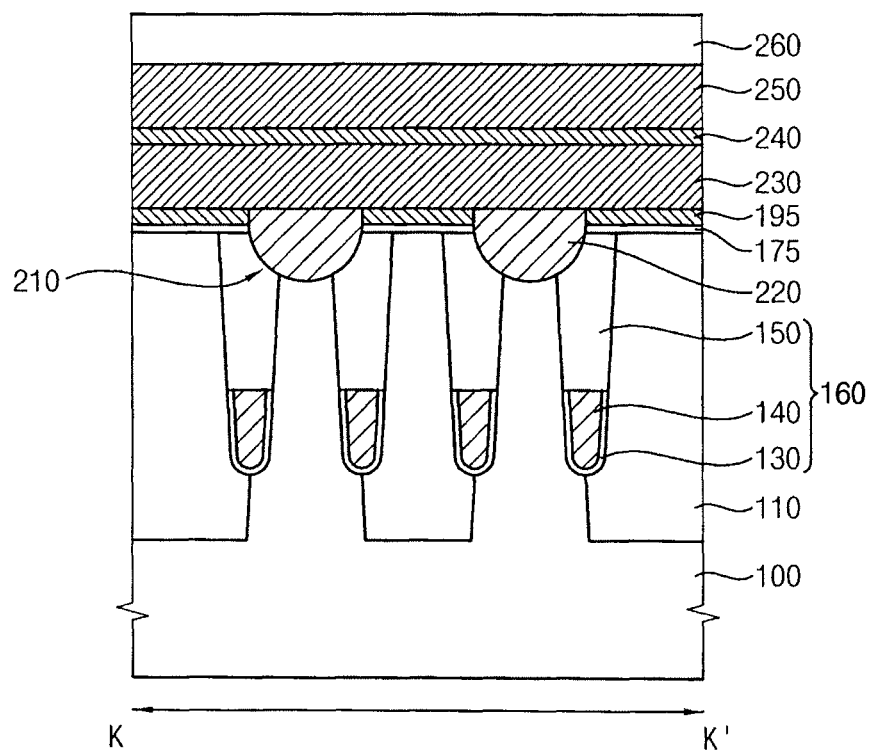

Referring to FIGS. 14 and 15, a polysilicon layer 230 doped with impurities, a barrier layer 240, a metal layer 250, and a third mask layer 260 may be sequentially formed on the first and second conductive layers 195 and 220.

The polysilicon layer 230 may be formed to include a material substantially the same as those of the first and second conductive layer patterns 195 and 220, and thus merged thereto. In example embodiments, the polysilicon layer 230 may be formed to have a second thickness thicker than the first thickness, e.g., about 300 angstroms.

The barrier layer 240 may be formed to include a metal nitride, e.g., tungsten nitride (WN), titanium nitride (TiN), tantalum nitride (TaN), etc. The metal layer 250 may be formed to include a metal having a resistance lower than those of the polysilicon layer 230 and/or the first and second conductive layer patterns 195 and 220, e.g., tungsten (W), etc. The third mask layer 260 may be formed to include a nitride, e.g., silicon nitride, etc.

Figure 16:
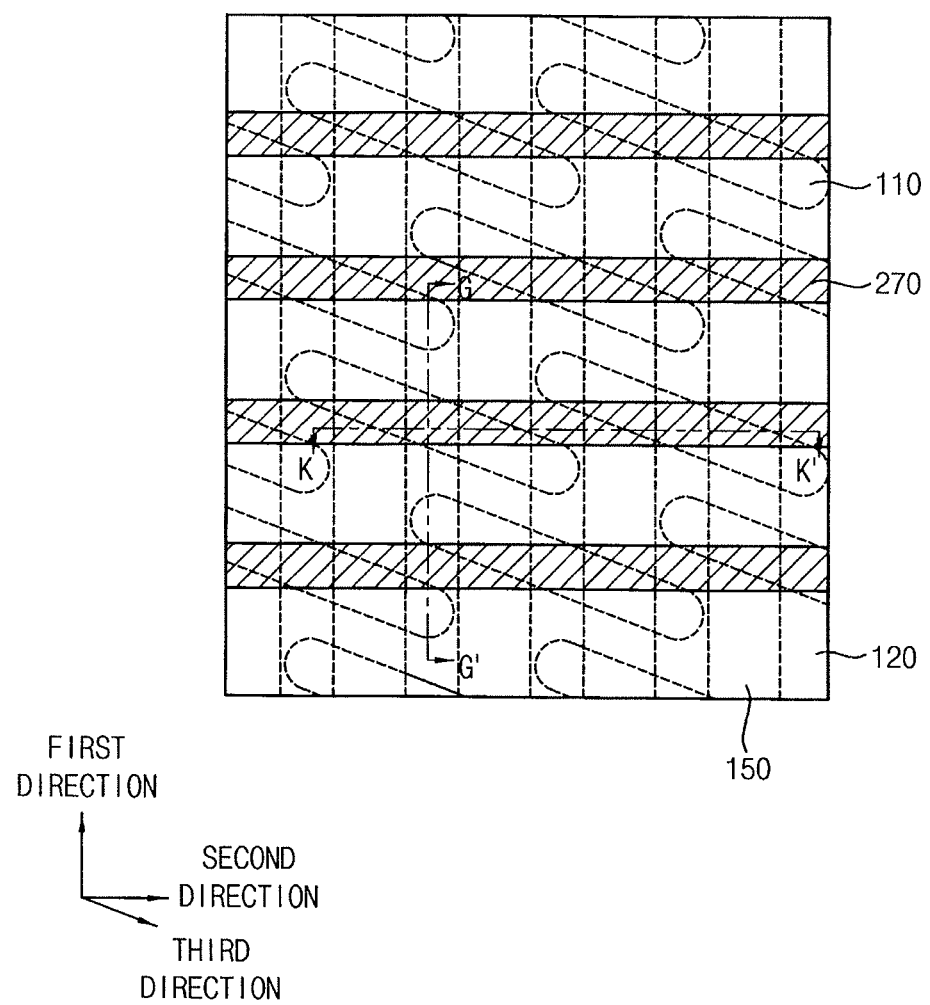
Figure 17:
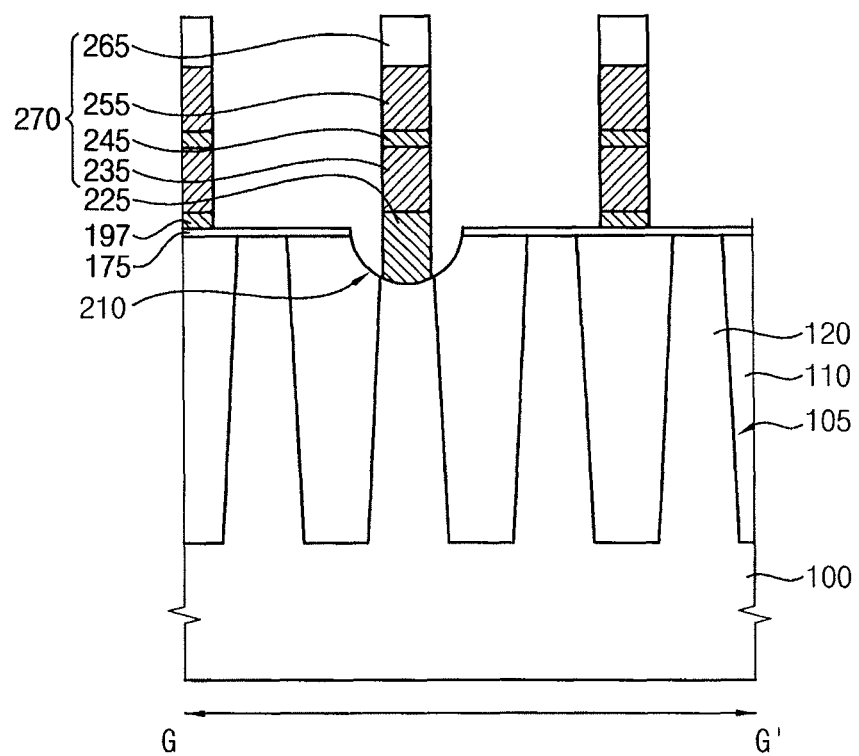
Figure 18:
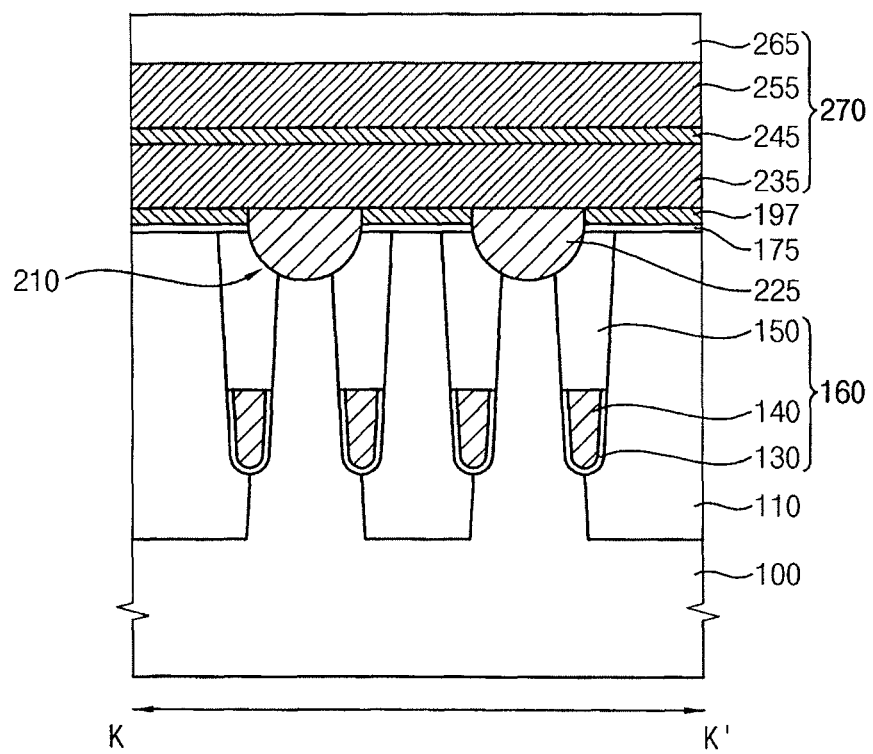

Referring to FIGS. 16 to 18, the third mask layer 260 may be etched to form the third mask 265, and the metal layer 250, the barrier layer 240, the polysilicon layer 260 and the first and second layer patterns 195 and 220 may be sequentially patterned using the third mask 265 as an etching mask. Accordingly, the bit line structure 270 including the polysilicon layer pattern 235, the barrier layer pattern 245, the metal layer pattern 255, and the third mask 265 sequentially stacked and the bit line contact 225 therebeneath may be formed. In addition, a portion of a top surface of the pad layer pattern 175 and an upper inner wall of the recess 210 may be exposed due to the patterning process.

The bit line contact 225 may be formed on the bottom surface of the recess 210 to contact the exposed top surface of the active region 120. In example embodiments, a plurality of bit line contacts 225 may be formed in the first and second directions, respectively, each of which may fill the recess 210 partially.

The bit line structure 270 may be formed to be electrically connected to the bit line contact 225 due to the polysilicon layer pattern 235. In example embodiments, a plurality of bit line structures 270 may be formed in the first direction, each of which may extend in the second direction.

Figure 19:
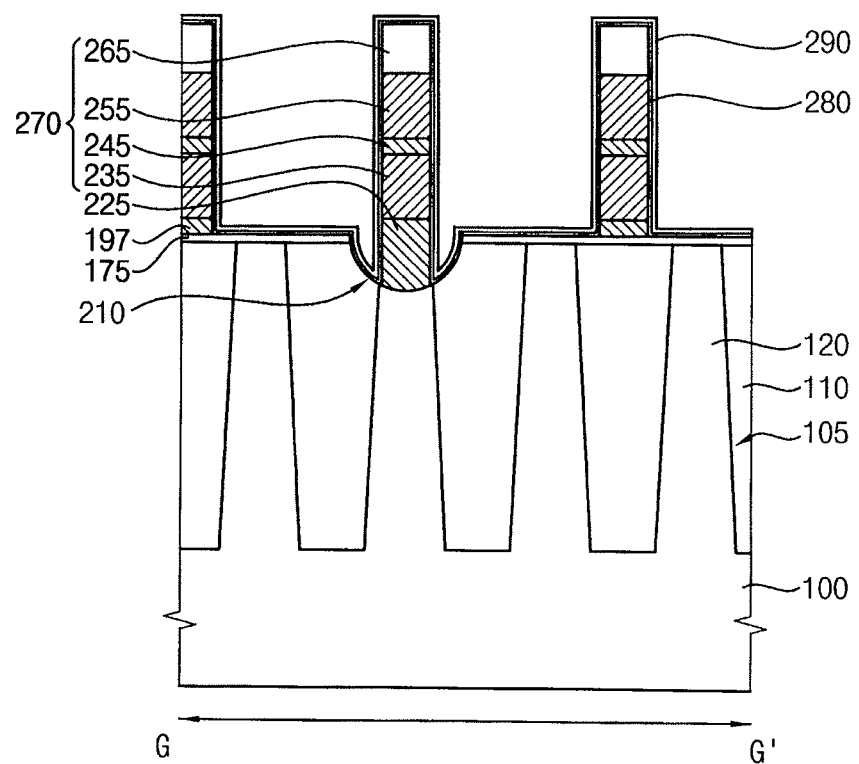

Referring to FIG. 19, first and second insulating layers 280 and 290 may be sequentially formed on the substrate 100 to cover the bit line contact 225 and the bit line structure 270.

The first insulating layer 280 may be formed on the exposed top surface of the pad layer pattern 175, the upper inner wall of the recess 210, a sidewall of the bit line contact 225, and the bit line structure 270. In example embodiments, the first insulating layer 280 may be formed by a plasma treatment process, and may contact the bit line contact 225 and the bit line structure 270 to have a constant thickness. The first insulating layer 280 may be formed to include a nitride, e.g., silicon nitride, etc.

The second insulating layer 290 may be formed on the first insulating layer 280. In example embodiments, the second insulating layer 290 may be formed by a CVD process or by an atomic layer deposition (ALD) process, and may be formed to have a constant thickness. The second insulating layer 290 may be formed to include a material substantially the same as that of the first insulating layer 280, i.e., a nitride, e.g., silicon nitride, etc., and thus merged thereto. In other words, as the first and second insulating layers 280 and 290 are formed of a same material, they are merged into a single insulating layer having a combined thickness of the first and second insulating layers 280 and 280. Thus, hereinafter, the merged layer of the first and second insulating layers 280 and 290 is referred to as a first spacer layer 285.

In example embodiments, the second insulating layer 290 may be formed to have a thickness thicker than that of the first insulating layer 280.

Figure 20:
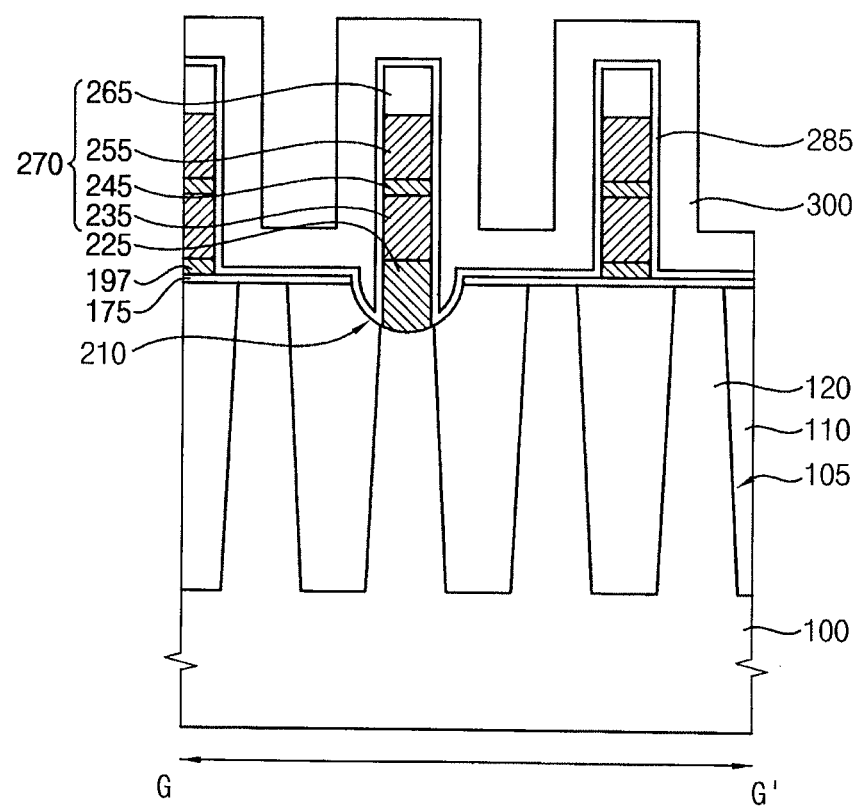

Referring to FIG. 20, a first sacrificial layer 300 may be formed on the first spacer layer 285. The first sacrificial layer 300 may be formed by a CVD process or an ALD process, and may be formed to include a material having an etch selectivity with respect to the first spacer layer 285. The first sacrificial layer 300 may be formed to include an oxide, e.g., boro-phospho-silicate glass (BPSG), tonen silazene (TOSZ), undoped silicate glass (USG), spin on glass (SOG), flowable oxide (FOX), tetra-ethyl-ortho-silicate (TEOS) or high density plasma chemical (HDP-CVD) oxide, etc. In example embodiments, the first sacrificial layer 300 may be formed to have a thickness thicker than that of the first spacer layer 285, and thus fill a remaining portion of the recess 210.

Figure 21:
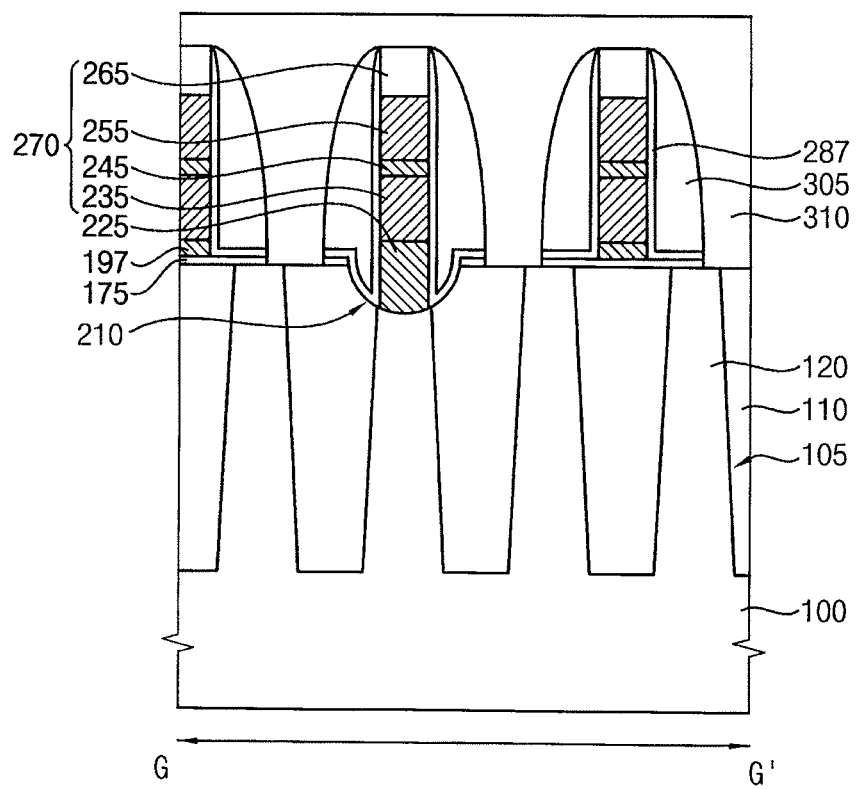

Referring to FIG. 21, the first sacrificial layer 300 and the first spacer layer 285 may be sequentially etched by performing a dry etching process to form a first sacrificial layer pattern 305 and the first spacer 287. An exposed portion of the pad layer pattern 175 in accordance with the dry etching process may be removed to expose a portion of the top surface of the substrate 100.

The first spacer 287 may be formed to surround sidewalls of the bit line contact 225 and the bit line structure 270, and to contact the sidewalls of the bit line contact 225 and the bit line structure 270. Accordingly, a plurality of first spacers 287 may be formed in the first direction, each of which may extend in the second direction. The first spacer 287 may be also formed on a remaining portion of the pad layer pattern 175 and the upper inner wall of the recess 210.

The first sacrificial layer pattern 305 may be formed on the first spacer 287 to surround the sidewalls of the bit line contact 225 and the bit line structure 270. Accordingly, a plurality of first sacrificial layer patterns 305 may be formed in the first direction, each of which may extend in the second direction. In example embodiments, the first sacrificial layer pattern 305 may be formed to fill the remaining portion of the recess 210. The first spacer 287 and the first sacrificial layer pattern 305 may be formed by independent etching processes, or by substantially the same etching process.

A second sacrificial layer 310 may be formed to sufficiently cover the first sacrificial layer pattern 305 and the bit line structure 270. The second sacrificial layer 310 may be formed on the exposed portion of the substrate 100, the first sacrificial layer pattern 305 and the third mask 265. The second sacrificial layer 310 may be formed to include a material having an etch selectivity with respect to the first sacrificial layer pattern 305 and the first spacer 287, e.g., a polymer such as carbon based spin-on hardmask (C—SOH) or amorphous carbon layer (ACL), etc.

Figure 22:
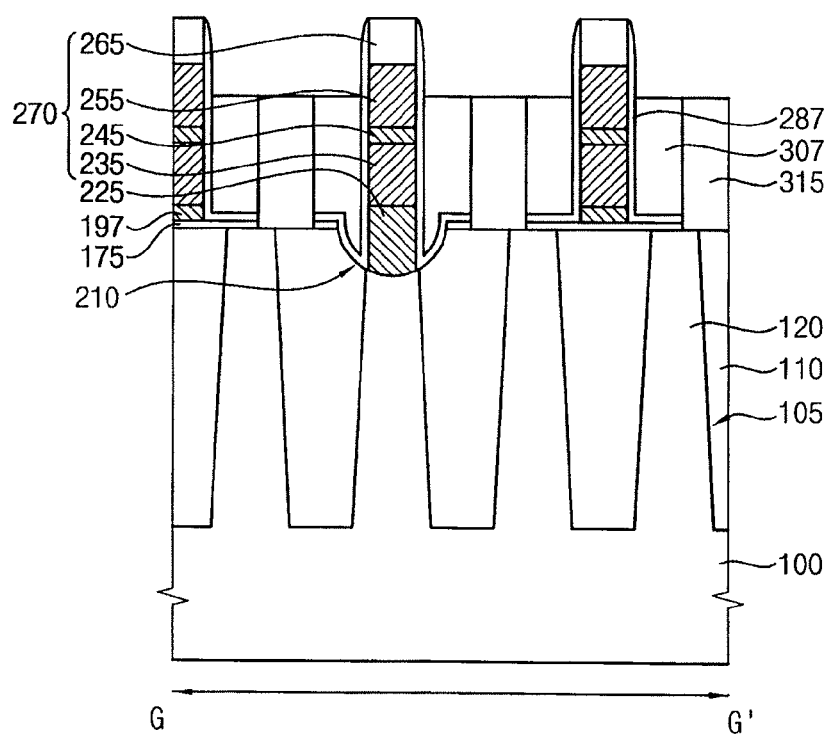

Referring to FIG. 22, upper portions of the second sacrificial layer 310 and the first sacrificial layer pattern 305 may be removed to form a second sacrificial layer pattern 315 and a third sacrificial layer pattern 307, respectively. The third sacrificial layer pattern 307 may be formed to cover a lower sidewall of the first spacer 287, and the second sacrificial layer pattern 315 may be formed on the exposed portion of the substrate 100 to contact the third sacrificial layer pattern 307, the first spacer 287, and the remaining portion of the pad layer pattern 175. An upper sidewall of the first spacer 287 and a top surface of the third mask 365 may be exposed.

The second sacrificial layer pattern 315 may be formed by performing a CMP process and/or an etch back process to etch the upper portion of the second sacrificial layer 310. In example embodiments, the second sacrificial layer pattern 315 may be formed to have a top surface lower than those of the first spacer 287 and/or the third mask 265, and thus an upper sidewall of the first sacrificial layer pattern 305 may not be covered by the second sacrificial layer pattern 315 but exposed.

The third sacrificial layer pattern 307 may be formed by removing the exposed upper portion of the first sacrificial layer pattern 305. The third sacrificial layer pattern 307 may be formed by an etching process using an etching gas having a high etch selectivity with respect to the first sacrificial layer pattern 305. In example embodiments, the third sacrificial layer pattern 307 may be formed to have a top surface substantially coplanar with the top surface of the second sacrificial layer pattern 315. In other example embodiments, the second and third sacrificial layer patterns 315 and 307 may be formed at the same time by a CMP process and/or an etch back process.

Figure 23:
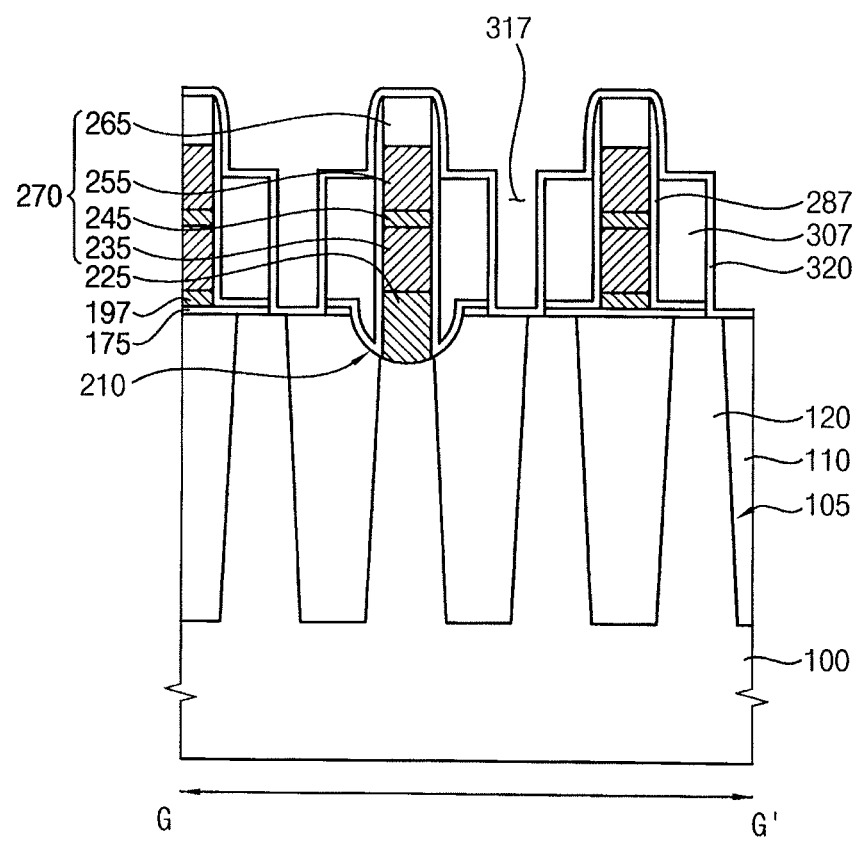

Referring to FIG. 23, the second sacrificial layer pattern 315 may be removed to form a first opening 317 exposing the portion of the top surface of the substrate 100. A second spacer layer 320 may be formed to cover the third sacrificial layer pattern 307, the first spacer 287, and the bit line structure 270.

In example embodiments, the second sacrificial layer pattern 315 may be sufficiently removed by a reactive ion etching (RIE) process or a plasma etching process. The first spacer 287 and the third mask 265 may surround the bit line contact 225, the polysilicon layer pattern 235, the barrier layer pattern 245, and the metal layer pattern 255, which may not be exposed, and thus may not be corroded or etched during the etching process. The portion of the top surface of the active region 120 may be exposed due to the removal of the second sacrificial layer pattern 315.

The second spacer layer 320 may be formed on a sidewall of the first opening 317, the exposed portion of the top surface of the substrate 100, the third sacrificial layer pattern 307, the first spacer 287, and the third mask 265. In example embodiments, the second spacer layer 320 may be formed to include a material substantially the same as that of the first spacer 287, i.e., a nitride, e.g. silicon nitride, etc., and thus may be merged thereto. The second spacer layer 320 may be formed to have a constant thickness.

Figure 24:
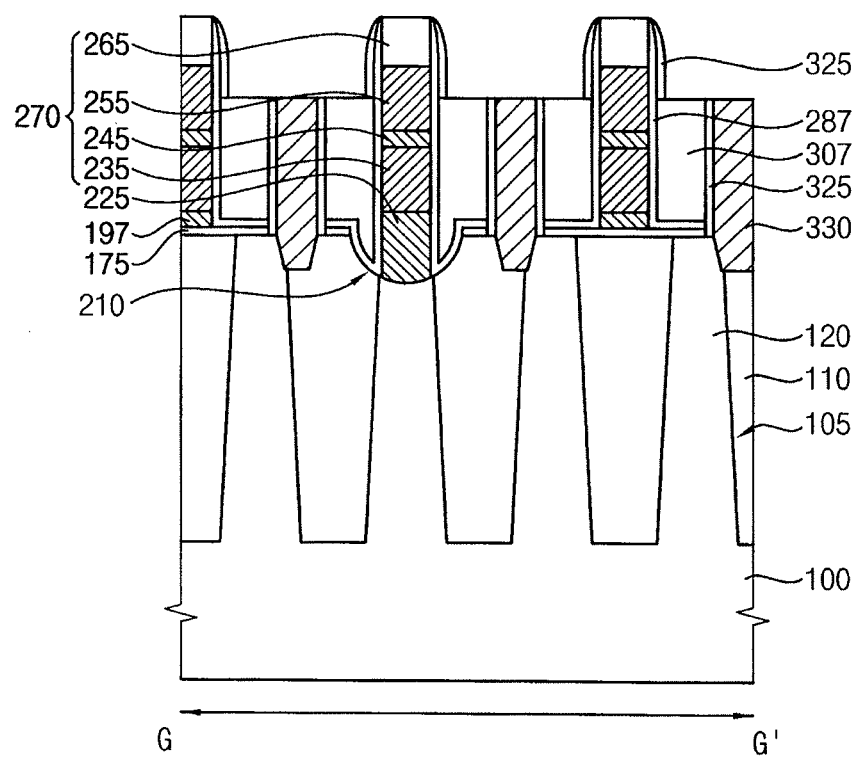

Referring to FIG. 24, the second spacer layer 320 may be anisotropically etched to form the second spacer 325. Accordingly, the second spacer 325 may be formed on the sidewall of the first opening 317 to contact sidewalls of the third sacrificial layer pattern 307, the first spacer 287, and the remaining portion of the pad layer pattern 175, and be also formed on a top surface of the third sacrificial layer pattern 307 to surround the upper sidewall of the first spacer 287. In example embodiments, a portion of the second spacer 287 on the sidewall of the first opening 317 may be formed to have a top surface substantially coplanar with the top surface of the third sacrificial layer pattern 307. A portion of the top surface of the substrate 100, a portion of the top surface of the third sacrificial layer pattern 307, and the top surface of the third mask 265 may be exposed by the etching process.

The exposed upper portion of the substrate 100 may be removed to form a third trench (not shown) in fluid communication with the first opening 317. A lower capacitor contact 330 may be formed to fill the third trench and the first opening 317.

The third trench may be formed by removing the upper portions of the substrate 100 and the isolation layer pattern 110. Accordingly, the top surface of the active region 120 may be partially exposed.

A third conductive layer may be formed on the substrate 100 to fill the third trench and the first opening 317, and an upper portion of the third conductive layer may be removed by a CMP process and/or an etch back process until the top surface of the third sacrificial layer pattern 307 may be exposed to form the lower capacitor contact 330. Accordingly, the lower capacitor contact 330 may contact at least a portion of the active region 120, and the second spacer 325 may surround a sidewall of the lower capacitor contact 330. The lower capacitor contact 330 may be formed to include, e.g., polysilicon doped with impurities and/or a metal.

Figure 25:
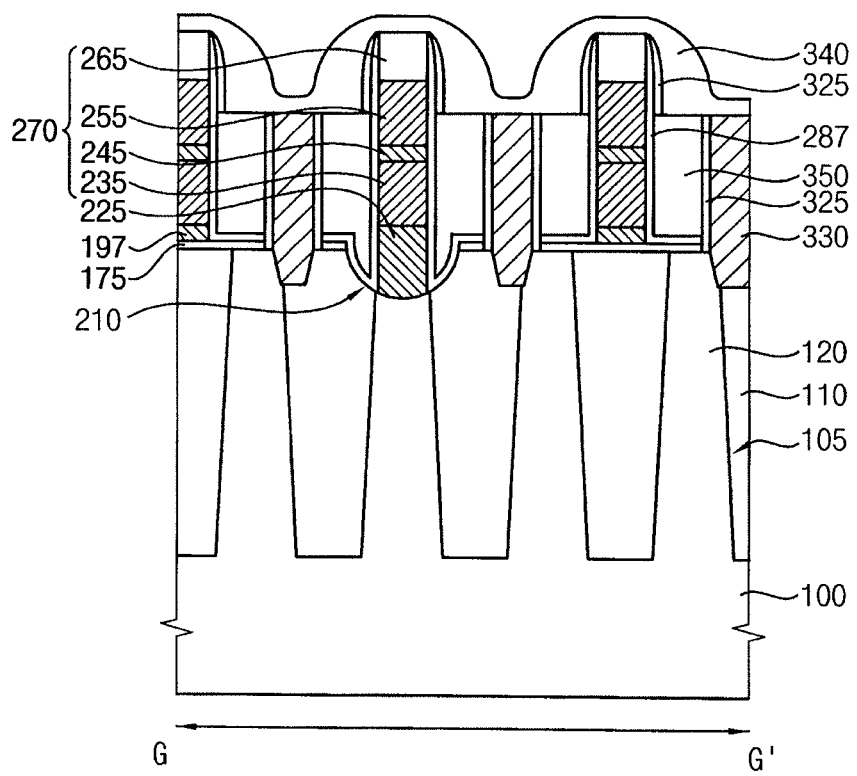

Referring to FIG. 25, the third sacrificial layer pattern 307 may be removed, and a third spacer layer 340 may be formed on the top surface of the third mask 265, the upper sidewall of the first spacer 287, and a top surface of the lower capacitor contact 330. The third spacer layer 340 may contact the portion of the second spacer 325 surrounding the upper sidewall of the first spacer 287 and a top surface of the portion of the second spacer 325 surrounding a sidewall of the lower capacitor contact 330. Accordingly, the gap 350 may be formed among the first and second spacers 287 and 325 and the lower capacitor contact 330.

In example embodiments, the third sacrificial layer pattern 307 may be removed by a wet etching process using hydrofluoric acid (HF), buffer oxide etchant (BOE) and/or low ammonium fluoride liquid (LAL) as an etchant. The first spacer 287 may contact and surround the sidewalls of the bit line contact 225 and the bit line structure 270 and have a constant thickness, and the bit line contact 225 and the bit line structure 270 may not be exposed. Thus, the bit line contact 225 and the bit line structure 270 may not be corroded or etched during the etching process. The third sacrificial layer pattern 307 may be sufficiently removed, and thus a second opening (not shown) may be formed to expose the sidewalls of the first and second spacers 287 and 325.

The third spacer 340 may be formed to include a material having a poor gap-fill characteristic, e.g., plasma enhanced oxide (PEOX). Accordingly, the third spacer layer 340 may not be formed in the second opening, but may be formed on the upper sidewall of the first spacer 287 and the top surface of the second spacer 325. That is, the second opening may not be filled completely to form the air gap 350.

Figure 26:
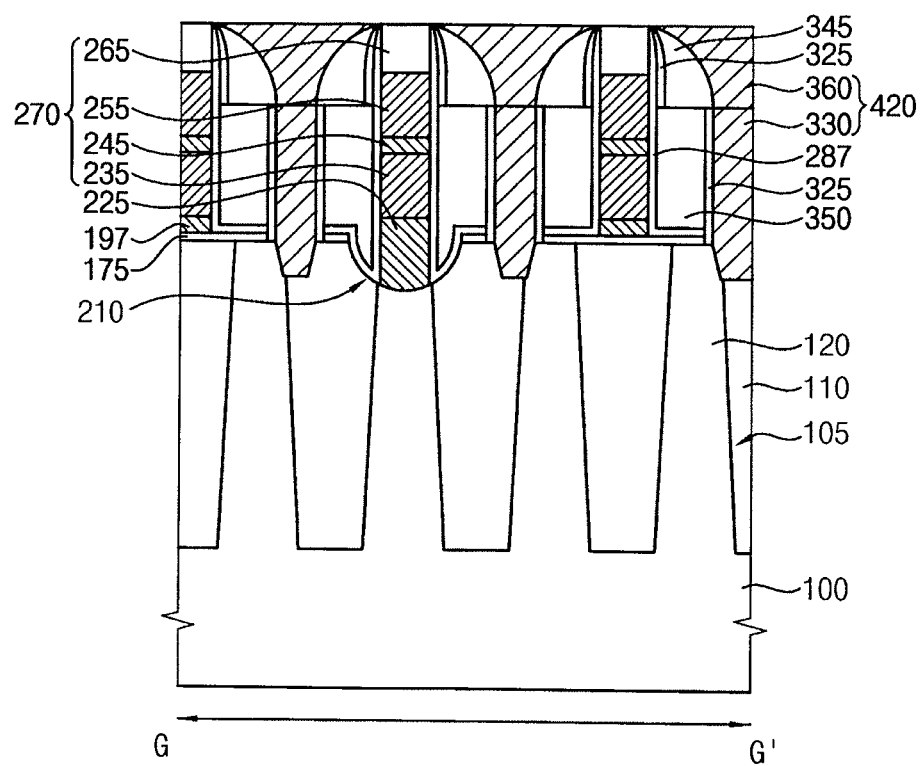

Referring to FIG. 26, the third spacer layer 340 may be anisotropically etched to form the third spacer 345. Accordingly, the third spacer 340 may be formed to contact the portion of the second spacer 325 surrounding the upper portion of the first spacer 287 and the top surface of the portion of the second spacer 325 surrounding the sidewall of the lower capacitor contact 330. In other example embodiments, the third spacer 340 may also contact the top surface of the lower capacitor contact 330. Due to the etching process, the top surface of the lower capacitor contact 330 may be exposed, so that a third opening (not shown) may be formed. The third opening may be defined by two third spacers 345 adjacent to each other and the exposed top surface of the lower capacitor contact 330.

The upper capacitor contact 360 may be formed on the lower capacitor contact 330 to fill the third opening. In example embodiments, a fourth conductive layer may be formed on the substrate 100 to sufficiently fill the third opening, and an upper portion of the fourth conductive layer may be planarized until the top surface of the third mask 265 is exposed. Accordingly, a bottom surface of the upper capacitor contact 360 may contact the lower capacitor contact 330, and the third spacer 345 may surround a sidewall of the upper capacitor contact 360. In example embodiments, the upper capacitor contact 360 may be formed to include a material substantially the same as that of the lower capacitor contact 330, e.g., polysilicon doped with impurities and/or a metal.

The lower and upper capacitor contacts 330 and 360 may be defined as a capacitor contact structure 420, which may be electrically connected to the bit line contact 225 the bit line structure 270.

Referring to FIGS. 1 and 2 again, the capacitor 410 may be formed on the capacitor contact structure 420. The capacitor 410 may be formed to contact the upper capacitor contact 360 to be electrically connected to the capacitor contact structure 420.

That is, the etch stop layer 370 and a mold layer (not shown) may be sequentially formed on the upper capacitor contact 360 and the third mask 265, and the etch stop layer 370 and the mold layer may be removed partially to form a hole (not shown) exposing top surfaces of the upper capacitor contacts 360. A lower electrode layer may be formed on an inner wall of the hole and the mold layer, a third sacrificial layer (not shown) may be formed on the lower electrode layer to sufficiently fill a remaining portion of the hole, and upper portions of the lower electrode layer and the third sacrificial layer may be planarized until a top surface of the mold layer may be exposed to divide the lower electrode layer into a plurality of pieces. Remaining portions of the third sacrificial layer and the mold layer may be removed by, e.g., a wet etching process, and thus the, e.g., cylindrical, lower electrode 380 may be formed. In other example embodiments, a pillar-shaped lower electrode 380 may be formed to sufficiently fill the hole.

The dielectric layer 390 may be formed on a surface of the lower electrode 380 and the etch stop layer 370, and the upper electrode 400 may be formed on the dielectric layer 390. Thus, the capacitor including the lower and upper electrodes 380 and 400 and the dielectric layer 390 may be formed.

In example embodiments, the upper electrode 400 may be formed to include a material substantially the same as that of the lower electrode 380, e.g., polysilicon doped with impurities and/or a metal. The dielectric layer 390 may be formed to include an insulating material such as an oxide, e.g., silicon oxide, a metal oxide, etc., or a nitride, e.g., silicon nitride, a metal nitride, etc. The metal may include aluminum (Al), zirconium (Zr), titanium (Ti), Hafnium (Hf), etc.

As described above, the first spacer 287 including a nitride, e.g. silicon nitride, may be formed as a single layer to contact the bit line contact 225 and the bit line structure 270 and surround sidewalls of the bit line contact 225 and the bit line structure 270. The first spacer 287 may be formed by a plasma treatment process, and thus may be formed to have a constant thickness. Accordingly, the first spacer 287 may not be damaged by a subsequent process performed during manufacturing the semiconductor device, and thus the bit line contact 225 and the bit line structure 270 may not be exposed. As a result, the bit line contact 225 and the bit line structure 270 may not be corroded or etched during a wet etching process for formation of the air gap 350.

Moreover, although the bit line contact 225 and/or the bit line structure 270 may be partially exposed due to a damage of the first spacer 287, a spacer including a silicon oxide used to generate a Galvanic corrosion during the wet etching process may not be formed adjacent to the bit line contact 225 and/or the bit line structure 270, and thus corrosion of the bit line contact 225 and/or the bit line structure 270 may be prevented.

By way of summation and review, a conventional semiconductor device including a BCAT may include a spacer on a wiring structure. However, if the spacer is damaged, the wiring structures may be corroded in a subsequent process, and thus a defect may be generated in the semiconductor device.

In contrast, example embodiments provide a semiconductor device having good electrical characteristics, and a method of manufacturing the same. That is, according to example embodiments, a spacer may be formed of nitride, e.g., silicon nitride, by a plasma treatment process to contact and surround sidewalls of a bit line contact and a bit line structure, so that the spacer may have a constant thickness. Thus, the spacer may not be damaged by a subsequent process for manufacturing a semiconductor device, thereby preventing exposure of the bit line contact and the bit line structure. As a result, the bit line contact and/or the bit line structure may not be corroded or etched during a wet etching process during formation of an air gap.

Moreover, an additional silicon oxide spacer, e.g., that may generate Galvanic corrosion during a wet etching process in a conventional semiconductor device structure, may not be formed adjacent to the bit line contact and/or the bit line structure according to embodiments. As such, even if the bit line contact and/or the bit line structure is partially exposed due to damage of the spacer by the subsequent process, corrosion of the bit line contact and/or the bit line structure may be prevented or substantially minimized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
    forming a bit line structure on a substrate, the bit line structure including a polysilicon layer pattern doped with impurities and a metal layer pattern on the polysilicon layer pattern;
    forming a first insulating layer including a nitride on a sidewall of the bit line structure by a plasma treatment process;
    forming a second insulating layer including a nitride on the first insulating layer, wherein the first and second insulating layer are merged to each other to define a single insulating layer;
    etching the single insulating layer anisotropically to form a first spacer surrounding and contacting the sidewall of the bit line structure, the first spacer having a constant thickness at least on sidewalls of the polysilicon layer pattern and the metal layer pattern; and
    forming a capacitor contact structure on the substrate, the capacitor contact structure together with the first spacer defining an air gap therebetween.

2. The method as claimed in claim 1, further comprising forming a bit line contact on the substrate to contact a bottom of the bit line structure.

3. The method as claimed in claim 1, wherein the bit line structure is formed to further include a barrier layer pattern between the polysilicon layer pattern and the metal layer pattern.

4. The method as claimed in claim 1, wherein forming the upper capacitor contact structure includes:
   forming first and second sacrificial layer patterns on the substrate, the first sacrificial layer pattern partially covering the first spacer, and the second sacrificial layer pattern contacting the first sacrificial layer pattern;
   removing the second sacrificial layer pattern to form an opening exposing a top surface of the substrate;
   forming a lower capacitor contact on the exposed top surface of the substrate to fill the opening;
   removing the first sacrificial layer pattern;
   forming a third spacer on a sidewall of the first spacer and the lower capacitor contact to define the air gap; and
   forming an upper capacitor contact on the lower capacitor contact.

5. The method as claimed in claim 4, wherein the first sacrificial layer pattern is formed to include silicon oxide, and removing the first sacrificial layer pattern includes performing a wet etching process.

6. The method as claimed in claim 4, further comprising forming a second spacer on a sidewall of the opening, after forming the opening.

7. The method as claimed in claim 6, wherein forming the second spacer includes:
   forming a second spacer layer on the bit line structure, the first spacer, the first sacrificial layer pattern and the exposed top surface of the substrate; and
   etching the second spacer layer anisotropically,
   wherein the second spacer is formed on the sidewall of the opening and a sidewall of the first spacer.

8. The method as claimed in claim 7, wherein forming the third spacer includes:
   forming a third spacer layer on the bit line structure, the second spacer and the lower capacitor contact; and
   etching the third spacer layer anisotropically.

9. The method as claimed in claim 4, wherein the upper capacitor contact is formed to be self-aligned with the third spacer.

10. The method as claimed in claim 4, wherein forming the first sacrificial layer pattern and the second sacrificial layer pattern includes, after forming the second insulating layer on the first insulating layer:
    forming a first sacrificial layer on the second insulating layer;
    etching the first sacrificial layer and the single insulating layer anisotropically to form the first sacrificial layer pattern and the first spacer, respectively, so that a portion of the top surface of the substrate is exposed;
    forming a second sacrificial layer on the first sacrificial layer pattern, the first spacer, the bit line structure and the exposed portion of the top surface of the substrate; and
    removing upper portions of the second sacrificial layer and the first sacrificial layer pattern, so that the second sacrificial layer is transformed into the second sacrificial layer pattern.

11. The method as claimed in claim 4, wherein the second sacrificial layer pattern is formed to include carbon based spin on hardmask (C—SOH) or amorphous carbon layer (ACL).

12. The method as claimed in claim 4, wherein the third spacer is formed to include plasma enhanced oxide (PEOX).

13. The method as claimed in claim 1, wherein the bit line structure further includes a mask including a nitride on the metal layer pattern.

* * * * *